(12) United States Patent
Bass et al.

(10) Patent No.: US 12,730,141 B2
(45) Date of Patent: Sep. 8, 2026

(54) EVENT DETECTION SYSTEM RESPONSE CONTROLLER

(71) Applicant: Raytheon Company, Waltham, MA (US)

(72) Inventors: Gregory L. Bass, Madison, AL (US); Vincent A. Pinedo, Tucson, AZ (US)

(73) Assignee: Raytheon Company, Tewksbury, MA (US)

( * ) Notice: Subject to any disclaimer, the term of this patent is extended or adjusted under 35 U.S.C. 154(b) by 384 days.

(21) Appl. No.: 18/371,895

(22) Filed: Sep. 22, 2023

(65) Prior Publication Data

US 2025/0102563 A1 Mar. 27, 2025

(51) Int. Cl.
*G01R 31/28* (2006.01)

(52) U.S. Cl.
CPC ................................ *G01R 31/2836* (2013.01)

(58) Field of Classification Search
CPC ............ G01R 31/2836; G01R 31/2832; G01R 31/28; G01R 31/00; G01R 31/31816; G01R 31/3181; G01R 31/317
See application file for complete search history.

(56) References Cited

U.S. PATENT DOCUMENTS 4,687,622 A 8/1987 Longden
5,010,321 A 4/1991 Larner
5,150,286 A 9/1992 Venditto, Jr.
5,943,507 A * 8/1999 Cornish .................. G06F 13/24 710/48
6,553,496 B1 4/2003 Buer
7,489,136 B1 2/2009 Poland
7,521,682 B1 4/2009 Holland
7,634,361 B2 12/2009 Levesque
7,858,425 B2 12/2010 Sanders
10,614,053 B2 4/2020 Baumann
2003/0172321 A1* 9/2003 Wolin ................. G06F 11/2215 714/41
2004/0124899 A1* 7/2004 Cavazos ............. H03K 3/0375 327/199

(Continued)

FOREIGN PATENT DOCUMENTS

CN 115902996 A 4/2023
WO 2023096927 A1 6/2023

OTHER PUBLICATIONS

Glein Robert et al: "BRAM implementation of a single-event upset sensor for adaptive single-event effect mitigation in reconfigurable FPGAs", 2017 NASA/ESA Conference On Adaptive Hardware and Systems (AHS), IEEE, Jul. 24, 2017, pp. 1-8.

(Continued)

*Primary Examiner* — Mohamed Charioui
(74) *Attorney, Agent, or Firm* — Getz Balich LLC

(57) ABSTRACT

An event detection system response controller for an electrical system includes at least one event detector (ED) digital filter submodule having a signal input and a signal output. The at least one ED digital filter submodule is configured to receive at least one event signal output from one or more event detectors at the signal input. Each of the at least one ED digital filter submodule includes a signal synchronizer, a signal filter, an interface validator, an interface validation filter, and a pulse shaper sequentially arranged from the signal input to the signal output.

20 Claims, 4 Drawing Sheets

(56) References Cited

U.S. PATENT DOCUMENTS

2008/0192877 A1* 8/2008 Eliezer .................. H03L 7/1806 375/376
2008/0239942 A1* 10/2008 Hsu ......................... G06F 11/26 370/216
2012/0144244 A1 6/2012 Dan
2015/0321011 A1* 11/2015 Carney .............. A61N 1/37276 607/62

OTHER PUBLICATIONS

International Search Report for PCT/US2024/039023 dated Nov. 18, 2024.

* cited by examiner

EVENT DETECTION SYSTEM RESPONSE CONTROLLER

This invention was made with Government support. The Government has certain rights in the invention.

BACKGROUND

1. Technical Field

The present disclosure relates to electrical systems including one or more event detectors and, more particularly, to an event detection system response controller for detecting and suppressing faults in the electrical system.

2. Background Information

Electrical systems exposed to harsh environmental conditions, such as nuclear radiation, may often require system intervention to mitigate and allow the systems to recover from system upset caused by the environmental conditions. For example, electrical systems including one or more event detectors may be susceptible to false event detections caused by or otherwise resulting from exposure to these harsh environmental conditions. Various electrical event detection systems are known in the art. While these known electrical event detection systems have various advantages, there is still room in the art for improvement.

SUMMARY

It should be understood that any or all of the features or embodiments described herein can be used or combined in any combination with each and every other feature or embodiment described herein unless expressly noted otherwise.

According to an aspect of the present disclosure, an event detection system response controller for an electrical system including one or more event detectors includes at least one event detector (ED) digital filter submodule having a signal input and a signal output. The at least one ED digital filter submodule is configured to receive at least one event signal output from the one or more event detectors at the signal input. Each of the at least one ED digital filter submodule includes a signal synchronizer, a signal filter, an interface validator, an interface validation filter, and a pulse shaper sequentially arranged from the signal input to the signal output. The signal synchronizer synchronizes the at least one event signal output to a digital clock domain of the event detection controller to generate an array of synchronized signal outputs. The signal filter applies a first filtering criteria to the array of synchronized signal outputs to generate an array of filtered signal outputs. The interface validator validates the array of filtered signal outputs using a correlated relationship of the array of filtered signal outputs. The interface validator generates a valid single-bit event output in response to validation of the array of filtered signal outputs. The interface validator filter applies a second filtering criteria to the valid single-bit event output to generate a single-bit filtered event output. The pulse shaper shapes a pulse duration of the single-bit filtered event output to generate a single-bit ED digital filter output signal at the signal output.

In any of the aspects or embodiments described above and herein, the first filtering criteria may include a minimum pulse-width criterion.

In any of the aspects or embodiments described above and herein, the signal filter may generate the filtered signal output, a transient detection interrupt signal, and transient state information for the synchronized signal output.

In any of the aspects or embodiments described above and herein, the second filtering criteria may include a minimum count criterion.

In any of the aspects or embodiments described above and herein, the at least one ED digital filter submodule may include one or more ED validation digital filter submodules. Each of the one or more ED validation digital filter submodule may be configured to be connected in signal communication with a respective one of the one or more event detectors to receive an event detect signal at the signal input.

In any of the aspects or embodiments described above and herein, the event detection system response controller may further include a system validation digital filter submodule having a second signal input and a second signal output. The system validation digital filter submodule may be connected in signal communication with each of the one or more ED validation digital filter submodules to receive the single-bit ED digital filter output signal at the second signal input from each of the one or more ED validation digital filter submodules. The system validation digital filter submodule may be configured to filter a single-event upset (SEU) signal of the single-bit ED digital filter output signal.

In any of the aspects or embodiments described above and herein, the system validation digital filter may include a second interface validator, a second interface validation filter, and a second pulse shaper sequentially arranged from the second signal input to the second signal output.

In any of the aspects or embodiments described above and herein, the at least one ED digital filter submodule may include an ED BIT controller digital filter submodule. The ED BIT controller digital filter submodule may be configured to generate a BIT request for one of the one or more event detectors.

In any of the aspects or embodiments described above and herein, the at least one ED digital filter submodule may include an ED reset controller digital filter submodule. The ED reset controller digital filter submodule may be configured to generate a reset request for one of the one or more event detectors.

In any of the aspects or embodiments described above and herein, the array of synchronized signal outputs and the array of filtered signal outputs may include a first number of signal outputs equal to a second number of signal outputs of the at least one event signal output.

In any of the aspects or embodiments described above and herein, the event detection system response controller may further include at least one programmable output module connected in signal communication with the signal output of the at least one ED digital filter submodule.

According to another aspect of the present disclosure, an electrical system includes a host processor, one or more event detectors, and an event detection system response controller connected in signal communication with and between the host processor and the one or more event detectors. Each of the one or more event detectors is configured to identify an occurrence of an event and generate an event output signal in response to the identification of the occurrence of the event. The event detection system response controller includes at least one event detector (ED) digital filter submodule having a signal input and a signal output. The at least one ED digital filter submodule is configured to receive the event output signal from the one or more event detectors at the signal input, detect a false detection state of the event output signal, suppress the event output signal, and report the false detection state of the event output signal to the host processor. Each of the at least one ED digital filter submodule includes a signal filter, an interface validator, an interface validation filter, and a pulse shaper sequentially arranged from the signal input to the signal output.

In any of the aspects or embodiments described above and herein, the signal filter may apply a first filtering criteria to the event output signal to generate a filtered signal output, the interface validator may validate the filtered signal output and generate a valid single-bit event output in response to validation of the filtered signal output, the interface validator filter may apply a second filtering criteria to the valid single-bit event output to generate a single-bit filtered event output, and the pulse shaper shapes a pulse duration of the single-bit filtered event output to generate a single-bit ED digital filter output signal at the signal output.

In any of the aspects or embodiments described above and herein, the first filtering criteria may include a minimum pulse-width criterion.

In any of the aspects or embodiments described above and herein, the second filtering criteria may include a minimum count criterion.

In any of the aspects or embodiments described above and herein, the at least one ED digital filter submodule may include one or more ED validation digital filter submodules. Each of the one or more ED validation digital filter submodule may be configured to be connected in signal communication with a respective one of the one or more event detectors to receive an event detect signal at the signal input.

In any of the aspects or embodiments described above and herein, the event detection system response controller may further include a system validation digital filter submodule having a second signal input and a second signal output. The system validation digital filter submodule may be connected in signal communication with each of the one or more ED validation digital filter submodules to receive the single-bit ED digital filter output signal at the second signal input from each of the one or more ED validation digital filter submodules. The system validation digital filter submodule may be configured to filter a single-event upset (SEU) signal of the single-bit ED digital filter output signal.

In any of the aspects or embodiments described above and herein, the system validation digital filter may include a second interface validator, a second interface validation filter, and a second pulse shaper sequentially arranged from the second signal input to the second signal output.

In any of the aspects or embodiments described above and herein, the at least one ED digital filter submodule may include an ED BIT controller digital filter submodule. The ED BIT controller digital filter submodule may be configured to generate a BIT request for one of the one or more event detectors.

In any of the aspects or embodiments described above and herein, the at least one ED digital filter submodule may include an ED reset controller digital filter submodule. The ED reset controller digital filter submodule may be configured to generate a reset request for one of the one or more event detectors.

The present disclosure, and all its aspects, embodiments and advantages associated therewith will become more readily apparent in view of the detailed description provided below, including the accompanying drawings.

DETAILED DESCRIPTION

Figure 1:
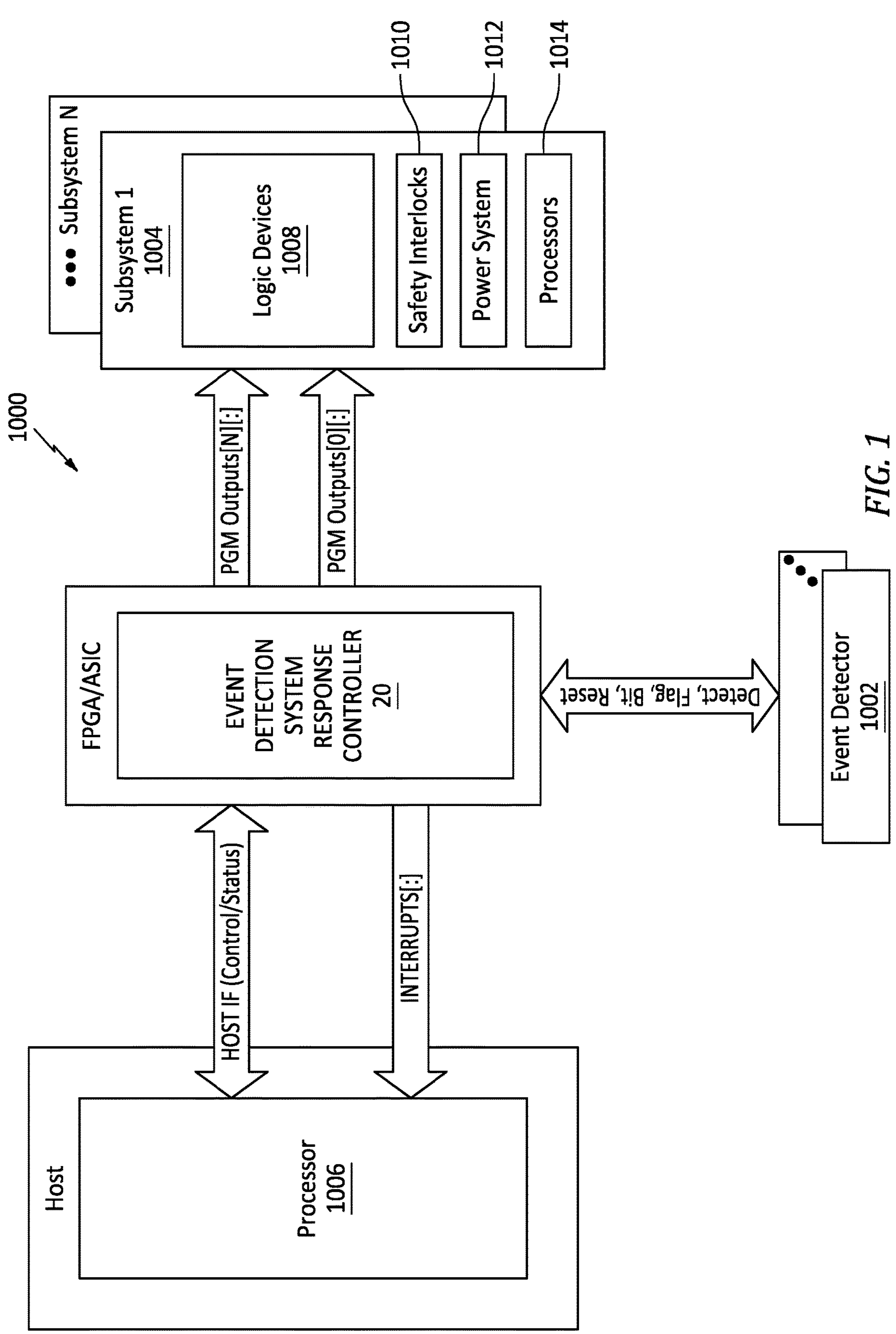
FIG. 1 is a diagrammatic illustration of an electrical system including an event detection system response controller, in accordance with one or more embodiments of the present disclosure.

The present disclosure is directed to an event detection system response controller for electrical systems and a method for using the same that may be used within a system that includes one or more event detectors and one or more electronic subsystems. The present disclosure provides particular utility when implemented within a logic device that can perform without upset or interruption when exposed to harsh environments (e.g., high-level nuclear radiation environment), among others. However, the present disclosure event detection system response controller is not limited to electrical systems configured for use in harsh environments (e.g., for nuclear radiation effects processing), and the event detection system response controller may also be used in any electrical system which has components or systems that require system intervention during and following a detected event.

The electrical system may include a plurality of subsystems, or devices, or other component structures (collectively referred to herein as "subsystems") that communicate within the electrical system via electronic communications. Some subsystems may be configured to only transmit electronic communications, other subsystems may be configured to only receive electronic communications, and still other subsystems may be configured to both receive and transmit electronic communications. The present disclosure is not limited to any particular electrical system configuration or subsystems configuration.

Present disclosure event detection system response controller embodiments may be configured for use in a variety of different electrical system applications. Within electrical systems, circuits may be exposed to electrical transients, through various means well-known within the industry, that if left unmanaged can cause undesirable system interruption and upset. Transients on critical system event signals such as an event detection pulse or flag must be managed and to the extent possible suppressed during processing to minimize false detection and unnecessary system interruption. The present disclosure facilitates configurable synchronization and pulse-width filtering at the individual signal level, event validation and filtering at the individual event detector level, and event validation and filtering at the electrical system level (e.g., across the event detectors). Configurations are provided facilitating system adaptability to control input/ output signal active-levels, output pulse-widths, individual output signal masks, output distribution throughout the event detection system response controller and distribution throughout the electrical system. The number of event detection system response controller outputs can be scaled at implementation and can be configured to address any number of system control needs such as, but not limited to, power enables, device/system resets, safety interlocks, status flags, and interrupts. The configurability of the processing logic facilitates configurability by the end-user to trade latency for false detection suppression and detection reliability. Additionally, the present disclosure event detection system response controller is configurable to facilitate timing of the intervention and recovery and, thereby, provide maximum end-user flexibility and end-use adaptability. Static or programmable configuration parameters may be used and may vary across implementations.

The present disclosure event detection system response controller may be inherently Single Event Upset (SEU) resistant by construction and function. The event detection system response controller may require multibit validation for BIT and reset operation (enable, request, and lockout), thereby facilitating filtering and/or suppression of transients at the signal, interface, and system level, interface lockouts on the detection, BIT, and reset interfaces, and providing masks for each output. These control points may be distributed through the processing chain allowing the event detection system response controller (e.g., via a host interface) to enable or disable interfaces as needed for system operation and reliability. SEUs may be automatically mitigated by the inherent construction and configuration of the filter and validation blocks. In addition to the mitigation of transients, the event detection system response controller logic may be configured to detect SEU or other transients and report them through status interrupts. The present disclosure, however, does not preclude the use of additional SEU mitigation techniques if required by the end user. For example, Triple Modular Redundancy (TMR) techniques may be applied at the block or logic level during implementation manually or through commonly available Electronic Design Automation (EDA) tools that offer such capability.

Referring to FIG. 1, the present disclosure provides a novel and non-obvious event detection system response controller 20 that may be used in a variety of different types of electrical systems. For example, the event detection system response controller 20 of FIG. 1 is part of an electrical system 1000. The electrical system 1000 of FIG. 1 further includes one or more event detectors 1002, one or more subsystems 1004, and a processor 1006 (e.g., a host processor). To facilitate the description herein, the present disclosure will be described with respect to the electrical system 1000 of FIG. 1. The present disclosure is not, however, limited to use with the particular electrical system 1000 architecture or configuration of FIG. 1.

The event detectors 1002 are connected in signal communication with the event detection system response controller 20. Each of the event detectors 1002 is configured to identify an occurrence of an event and to generate an event output signal in response to the identification of the occurrence of the event. The event detectors 1002 described herein may be configured to generate one or more correlated event output signals (a detect signal, a flag signal, etc.). For example, when a parameter (e.g., radiation dose-rate, temperature, pressure, lightning, etc.) measured by the event detector 1002 exceeds a threshold value for the parameter, the event detector 1002 may generate an event output signal identifying detection of the event. The generated event output signals from the event detectors 1002 are provided to the event detection system response controller 20.

The one or more subsystems 1004 of the electrical system 1000 are configured to execute various functions of the electrical system 1000. Each of the subsystems 1004 may include logic devices 1008, safety interlocks 1010, power systems 1012, one or more processors 1014, and/or other electrical or electronic components connected in signal communication with the event detection system response controller 20 and configured to be controlled by or otherwise send and/or receive information from the event detection system response controller 20.

The processor 1006 may be a processor of a host for the electrical system 1000. The host may be any hardware device configured to permit access to a network via a user interface, specialized software, network address, protocol stack, or any other hardware or software configuration. Alternatively, for example, the processor 1006 may be a component of one of the subsystems 1004. The processor 1006 may include any type of computing device, computational circuit, processor(s), CPU, computer, or the like capable of executing a series of instructions that are stored in memory. Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. The instructions may include an operating system, and/or executable software modules such as program files, system data, buffers, drivers, utilities, and the like. The executable instructions may apply to any functionality described herein to enable the electrical system 1000 and its components to accomplish the same algorithmically and/or by coordination of the electrical system 1000 components. The memory may include a single memory device or a plurality of memory devices (e.g., a computer-readable storage device that can be read, written, or otherwise accessed by a general purpose or special purpose computing device), including any processing electronics and/or processing circuitry capable of executing instructions. The present disclosure is not limited to any particular type of memory device, which may be non-transitory, and may include read-only memory, random access memory, volatile memory, non-volatile memory, static memory, dynamic memory, flash memory, cache memory, volatile or non-volatile semiconductor memory, optical disk storage, magnetic disk storage, magnetic tape, other magnetic storage devices, or any other medium capable of storing one or more instructions, and/or any device that stores digital information. The memory device(s) may be directly or indirectly coupled to the electrical system 1000.

Figure 2:
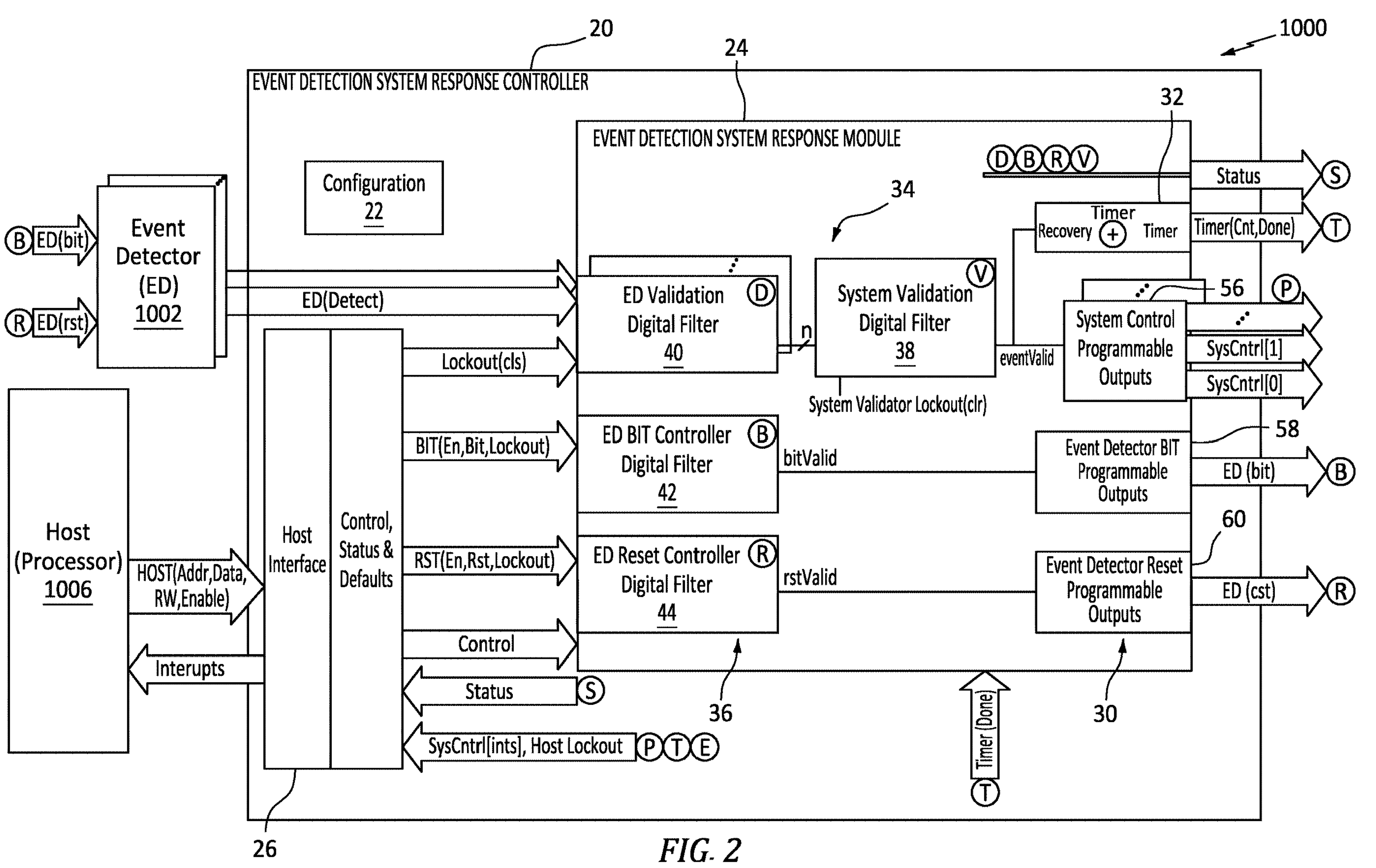
FIG. 2 is a diagrammatic illustration of the event detection system response controller, in accordance with one or more embodiments of the present disclosure.

The event detection system response controller 20 of FIG. 1 is connected in communication (e.g., electrical communication, signal communication, etc.) with the event detectors 1002, the subsystems 1004, and the processor 1006. For example, the event detection system response controller 20 of FIG. 1 interconnects the event detectors 1002, the subsystems 1004, and the processor 1006. The event detection system response controller 20 may be formed by or may otherwise include an application-specific integrated circuit (ASIC), a field-programmable gate array (FPGA), or the like. Referring to FIG. 2, the event detection system response controller 20 includes a configuration module 22 and an event detection (ED) system response module 24. The event detection system response controller 20 may further include a host interface 26. Briefly, the host interface 26 may facilitate an externally accessible address and data interface suitable for connecting the event detection system response controller 20 in signal communication with the processor 1006. The host interface 26 may set programmable control parameters, read status indicators, and monitor event detection system response controller 20 interrupts which may be communicated to the processor 1006.

The configuration module 22 contains static and/or dynamically programmed user configuration parameters. Both static and programmable configuration parameters may be used and may vary across implementations of the event detection system response controller 20. The use of static versus dynamically programmed parameterization is a design detail which may be chosen during implementation based on the required needs of the electrical system 1000.

The ED system response module 24 is connected in signal communication with the processor 1006. For example, the ED system response module 24 of FIG. 2 is connected in signal communication with the processor 1006 by the host interface 26. The ED system response module 24 is further connected in signal communication with the event detectors 1002 and the subsystems 1004. The ED system response module 24 facilitates processing and validation of event inputs for one or more of the event detectors 1002 with one or more detection signals for each of the event detectors 1002. The ED system response module 24 additionally facilitates Safe-BIT and Safe-Reset controls for the event detectors 1002 as well as various fault and diagnostic status outputs. The event detector system response module 24 of FIG. 2 includes a plurality of digital filter submodules 34, one or more programmable output modules 30, and a timer module 32.

The plurality of digital filter submodules 34 are configured for detecting and validating critical event inputs at the signal, interface, and system levels. The plurality of digital filter submodules 34 includes a plurality of event detector (ED) digital filter submodules 36 and a system validation digital filter submodule 38. The ED digital filter submodules 36 of FIG. 2 include one or more event detector (ED) validation digital filter submodules 40, an event detector (ED) BIT controller digital filter submodule 42, and an event detector (ED) reset controller digital filter submodule 44. The present disclosure, however, is not limited to the foregoing exemplary submodules 40, 42, 44 for the ED digital filter submodules 36.

As will be discussed in further detail, the ED digital filter submodules 36 are arrayed to auto-scale to support any number of external event detectors 1002. The ED digital filter submodules 36 additionally facilitate safe, controlled, and valid execution of built-in-test (BIT) and reset of the event detectors 1002. The ED system response module 24 may generate status indicators to inform components of the electrical system 1000 (e.g., the subsystems 1004) of a current state of the event detection system response controller 20. These status indicators may include, but are not limited to, transient detection at the signal, interface, and system levels, validation faults at the interface and system levels, and state information including real-time values throughout each processing step within the digital filter submodules 34. State information may include detection results and faults for each signal, interface, and for the overall electrical system 1000. These status indicators may further indicate the current state of BIT and reset signals. The status indicators provide detailed, real-time information of the overall state and operation of the event detection system response controller 20 that can be used for performance monitoring and system diagnostics. The configuration of the digital filter submodules 34 of the ED system response module 24 facilitates resistance to single-event upsets (SEU; also known as a "single-event error" (SEE); e.g., a change of logic state caused by one single ionizing particle such as inions, electrons, photons, and the like) due to radiation exposure or other electrical transients within the electrical system 1000. The status indicators may be used, for example, by the processor 1006 and/or the subsystems 1004 for additional operations, system diagnostics, and/or reporting.

Figures 3, 4:
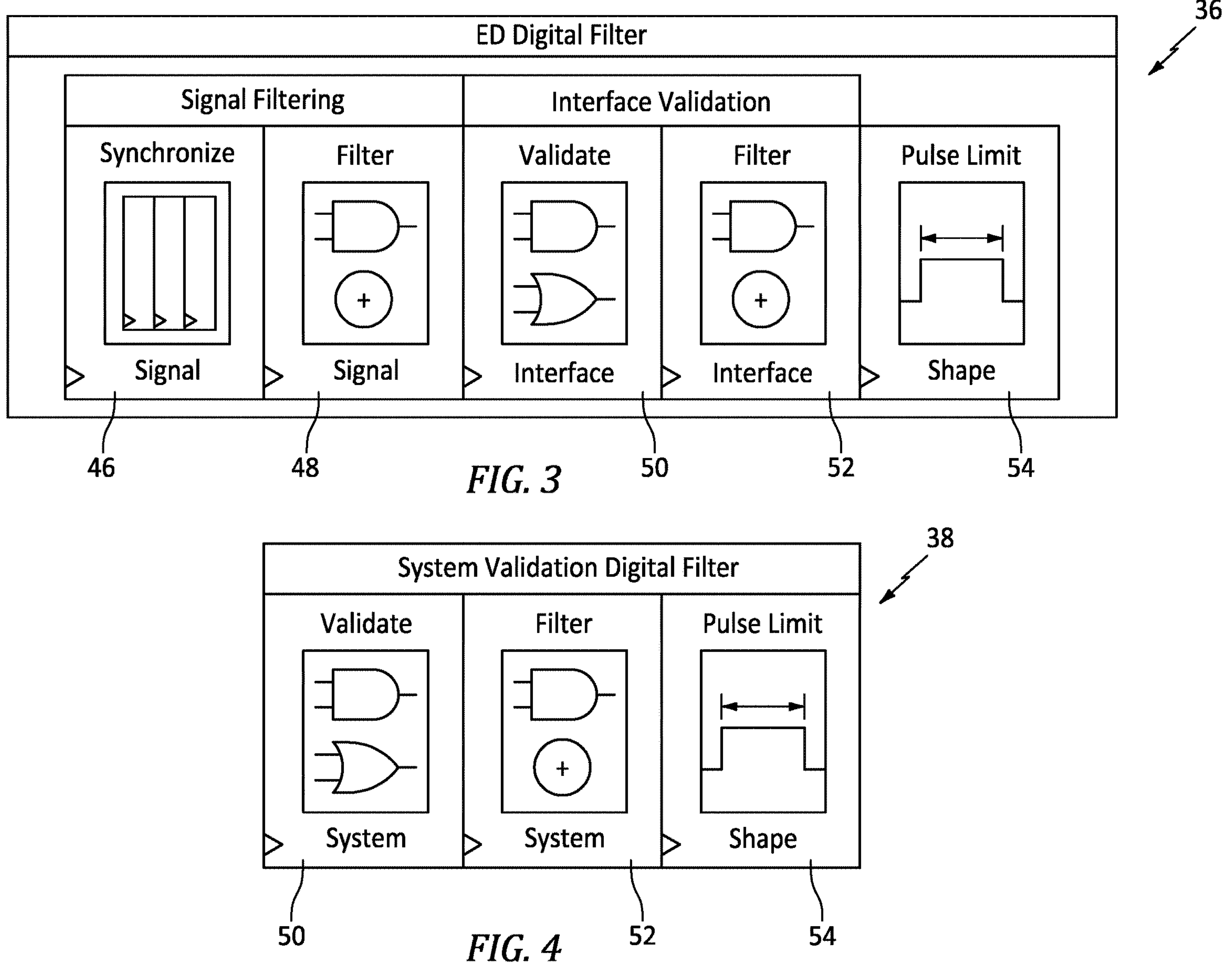
FIG. 3 is a diagrammatic illustration of an event detector digital filter submodule for the event detection system response controller, in accordance with one or more embodiments of the present disclosure.
FIG. 4 is a diagrammatic illustration of system validation digital filter submodule for the event detection system response controller, in accordance with one or more embodiments of the present disclosure.

FIG. 3 diagrammatically illustrates an exemplary configuration of one of the ED digital filter submodules 36 (e.g., the one or more ED validation digital filter submodules 40, the ED BIT controller digital filter submodule 42, and/or the ED reset controller digital filter submodule 44). The ED digital filter submodule 36 facilitates synchronizing, filtering, validation, and/or pulse shaping functionality for signals from the event detectors 1002 and/or the processor 1006. In particular, the ED digital filter submodule 36 of FIG. 3 includes a series of deliberately ordered processing components which implement a process for synchronizing, filtering, validating, and pulse-shaping signals (e.g., event detection signals). The ED digital filter submodule 36 of FIG. 3 includes a signal synchronizer 46, a signal filter 48, an interface validator 50, an interface validation filter 52, and a pulse shaper 54 sequentially ordered from an input to an output of the ED digital filter submodule 36. The sequential order of processing components 46, 48, 50, 52 of the ED digital filter submodule 36 facilitates signal and interface level filtering and validation. For example, the configuration of the ED digital filter submodule 36 with the signal filter 48 before and the interface validator 50 and the interface validation filter 52 after the interface validator 50 facilitates the bypassing of any operation (effectively feed-through) without the need to multiplex around each operation. The signal synchronizer 46 and the signal filter 48 following the signal synchronizer 46 form a signal filtering stage of the ED digital filter module 36 for each signal (e.g., event detection signal) input. The output of the signal filtering stage is an array of outputs that is equal to the number of signal inputs. The output array from the signal filtering stage is fed to an interface validation stage of the ED digital filter submodule 36 formed by the interface validator 50 and the interface validation filter 52. The interface validator performs a validation operation which produces an event result that is fed to the interface validation filter 52. The output of the interface validation stage (e.g., the interface validation filter 52) is fed to the pulse shaper 54. The respective outputs of the interface validator 50, the interface validation filter 52, and the pulse shaper 54 are a single bit. The ED digital filter submodule 36 facilitates validation of inputs against a set of configured criteria to minimize false event detection. The utility of the ED digital filter submodule 36 is not limited to the particular application described herein for the interfaced system response module 24 and aspects of the ED digital filter submodule 36 may be applied to any digital discrete input for processing and filtering and for any set of digital discrete inputs that have a shared, defined relationship that can be validated against a set of configured criteria.

The signal synchronizer 46 synchronizes signal inputs to the ED digital filter submodule 36 to the digital clock domain for the event detection system response controller 20 (see FIG. 2). The signal synchronizer 46 may include a signal synchronizing component for each event input signal.

The event input is arrayed and will auto-scale to support any number of individual discrete input signals. Latency through the signal synchronizer 46 may be configured during implementation. If the event input signals to the ED digital filter submodule 36 are already synchronous to the digital clock domain for the event detection system response controller 20, then the signal synchronizer 46 may be configured to reduce latency by eliminating registration stages. The input active signal-levels can be configured at implementation to accommodate either active-low or active-high assertion levels. This feature allows direct connect to any digital signal-level event without the need for external hardware signal level inversion. The signal synchronizer 46 is not limited to any particular configuration and the signal synchronizer 46 may be implemented using any suitable signal synchronizing component or logic conventionally known in the art.

The signal filter 48 is configured, for each signal output of the signal synchronizer 46, to detect, report, and suppress signal transients. A transient, in this context, is any asserted signal that does not meet or exceed a minimum set of conditions determined by filtering criteria. For each signal input, the signal filter 48 generates one filtered result output, a transient detection interrupt, and transient state information. As an example, the signal filter 48 may reject any output signal from the signal synchronizer 46 which does not meet a minimum pulse-width and report that a transient was detected and suppressed. The transient state information generated may be dependent on the particular configuration of the signal filter 48. For a pulse-width filter, the transient state information may be equal to the width of the transient pulse at the time of the transient detection interrupt. For a pattern-correlator filter, the transient state information may be the pattern detected that failed to match the expected pattern at the time of the transient detection interrupt. Configurations of the signal filter 48, however, are not limited to the aforementioned exemplary pulse-width filter and pattern-correlator filter configurations. For embodiments of the electrical system 1000 in which no signal filtering is required, the signal filter 48 can be configured, for example, to passthrough by setting the filter depth (e.g., period or clock count) to 0. The signal filter 48 may be disabled, ignoring all inputs, and producing no output, by asserting a clear signal input.

The interface validator 50 verifies a defined relationship exists between inputs to the interface validator 50 (e.g., from the signal filter 48) and that this relationship meets or exceeds the configured criteria. The interface validator 50 validates input signals received from the signal filter 48 by ensuring a correlated relationship across the input signal array. The validation process employed may be an M-of-N (M:N) voter process, where M equals the minimum number of signals that must be asserted, and N equals the total number of input signals. M may be configured to any value from 1 to N. This M:N voter process asserts a single bit result output when a count equal to or greater than M input signals are asserted from the total of N inputs. The latency through the interface validator 50 is equal to the number of configured registration stages. A latency configuration of 0 would result in a purely logical operation with no registration. The interface validator 50 may be disabled, ignoring all inputs, and producing no output, by asserting a clear signal input. The interface validator 50 may also be configured to detect, report, and suppress interface faults. An interface fault may be defined as one or more asserted inputs whose overall asserted count does not meet or exceed the minimum validation threshold of M:N. Interface fault detection may be reported by asserting a fault detection interrupt along with fault state information identifying the validation results (e.g., actual count of actual signals asserted).

The interface validation filter 52 is configured to filter validation output signals from the interface validator 50 which do not meet or exceed a minimum set of conditions defined by the configured filtering criteria. Transients may also be detected and reported. The interface validation filter 52 receives a single bit event result from the interface validator 50 and generates a single bit filtered event output. The interface validation filter 52 may be configured to process the input from the interface validator 50 to ensure that it is valid for a specified period or number of digital clock counts. Any input that does not meet or exceed the minimum period or count may be rejected and reported as a fault. The interface validation filter 52 may be similar in design and construction to the signal filter 48. The interface validation filter 52 may be configured to passthrough by setting the filter depth (period or clock count) to 0. The interface validation filter 52 may be disabled, ignoring all input, and producing no output, by asserting a clear signal input.

The pulse shaper 54 shapes the output of the ED digital filter submodule 36 for downstream or external processing, for example, by shaping the output with a minimum and/or maximum pulse duration up to and including a latched output with an external clear. The pulse shaper 54 is implemented immediately following the interface validation filter 52 to receive the filtered output signal from the interface validation filter 52. Using a combination of the minimum and maximum pulse-width configuration options, the pulse shaper 54 can be configured to shape the output pulse of the ED digital filter submodule 36 to meet any pulse-width needs of the consuming downstream system (e.g., the subsystems 1004). For instance, the pulse shaper 54 may be configured to execute pulse shaping for a minimum with no maximum, a maximum with no minimum, a minimum and a maximum, neither a minimum nor a maximum but a latch with clear, or no minimum, no maximum, no latch which will result in a passthrough. The pulse shaper 54 may be disabled, ignoring all input, and producing no output, by asserting a clear signal input.

Referring again to FIG. 2, the one or more ED validation digital filter submodules 40 facilitate processing of event signals from the event detectors 1002 while minimizing and reporting false detections. The ED validation digital filter submodules 40 are connected in signal communication with the processor 1006 (e.g., by the host interface 26). Each of the ED validation digital filter submodules 40 is connected in signal communication with a respective one of the event detectors 1002. The ED validation digital filter submodules 40 are further connected in signal communication with the system validation digital filter submodule 38. A SEU received as an input to the ED validation digital filter submodule 40 may be cleared automatically by the ED validation digital filter submodule 40 provided the criteria selected requires more than one bit to be set or for a bit to be set for more than one clock cycle. Processing within the ED validation digital filter submodule 40 facilitates additional protection from SEUs at the system level if a ED validation digital filter submodule 40 output is upset and asserted. For example, the upset may be detected and reported as a validation fault in the interface validation stage of the ED validation digital filter submodule 40 and the upset may be cleared by the host (e.g., the processor 1006) or external logic if no host is present.

The ED BIT controller digital filter submodule 42 is configured to process event detector 1002 BIT requests from the processor 1006 while minimizing and reporting false requests due to external influences that produce transients or faults, but which are not a result of an actual request. Faults may be produced by, but are not limited to, SEUs, invalid or improperly timed requests from a HOST, or other electrically induced signal assertions. The ED BIT controller digital filter submodule 42 is connected in signal communication with and between the processor 1006 (e.g., by the host interface 26) and one of the programmable output modules 30. The ED BIT controller digital filter submodule 42 uses the array signal inputs of the digital filter submodule 34 configuration to ensure that more than one signal is required to request a BIT operation. A BIT enable input and a BIT request input of the ED BIT controller digital filter submodule 42 are required to be simultaneously asserted while the lockout input (e.g., digital filter clear) is de-asserted. These signals are also subject to the filtering and validation criteria configuration defined during implementation, for example, the correlation of M:N (M=N, all signals at appropriate levels) for a minimum period or clock cycle counts. Faults may be reported as described for the processing components 46, 48, 50, 52, 54 of the ED digital filter submodule 36 above. The BIT valid result of the ED BIT controller digital filter submodule 42 is an output to the ED system response module 24. The BIT valid result is processed by one of the programmable output modules 30 for processor 1006 BIT requests. A status output may also be provided to alert the host (e.g., the processor 1006) or external logic that a BIT operation is in progress.

The ED reset controller digital filter submodule 44 is configured to process processor 1006 reset requests while minimizing and reporting false requests due to external influences that produce transients or faults which are not a result of an actual request. The ED reset controller digital filter submodule 44 is connected in signal communication with and between the processor 1006 (e.g., by the host interface 26) and one of the programmable output modules 30. The overall construction and operation of the ED reset controller digital filter submodule 44 is similar to the ED BIT controller digital filter submodule 42. However, the ED reset controller digital filter submodule 44 may have different configuration options specified by the user at implementation. The reset result of the ED reset controller digital filter submodule 44 is an output to the ED system response module 24. The reset result is processed by one of the programmable output modules 30 for processor 1006 reset requests. A status output may also be provided to alert the host (e.g., the processor 1006) or external logic that a reset operation is in progress.

The system validation digital filter submodule 38 is configured to process one or more signals from one or more of the ED validation digital filter submodules 40. The system validation digital filter submodule 38 is connected in signal communication with the ED validation digital filter submodules 40. The system validation digital filter submodule 38 is further connected in signal communication with the timer module 32 and one or more of the programmable output modules 30. Any SEU observed at the event inputs of the system validation digital filter submodule 38 is subject to the filtering and validation criteria by the system validation digital filter submodule 38 and may be subsequently rejected or suppressed. Any SEU observed by the system validation digital filter submodule 38 may also be subject to the same filtering and validation criteria discussed above for the ED digital filter submodules 36, thereby providing resistance to such transients. For example, upsets may be detected and reported as described for the ED digital filter submodules 36 above. The output of the system validation digital filter submodule 38 is an output to the ED system response module 24. The output is processed by the timer module 32 and by the programmable output modules 30. FIG. 4 diagrammatically illustrates an exemplary configuration of the system validation digital filter submodule 38. The system validation digital filter submodule 38 of FIG. 4 includes the interface validator 50, the interface validation filter 52, and the pulse shaper 54 sequentially ordered from an input to an output of the system validation digital filter submodule 38. The system validation filter 38 may be disabled, ignoring all input, and producing no output, by asserting a clear signal input.

Figure 5:
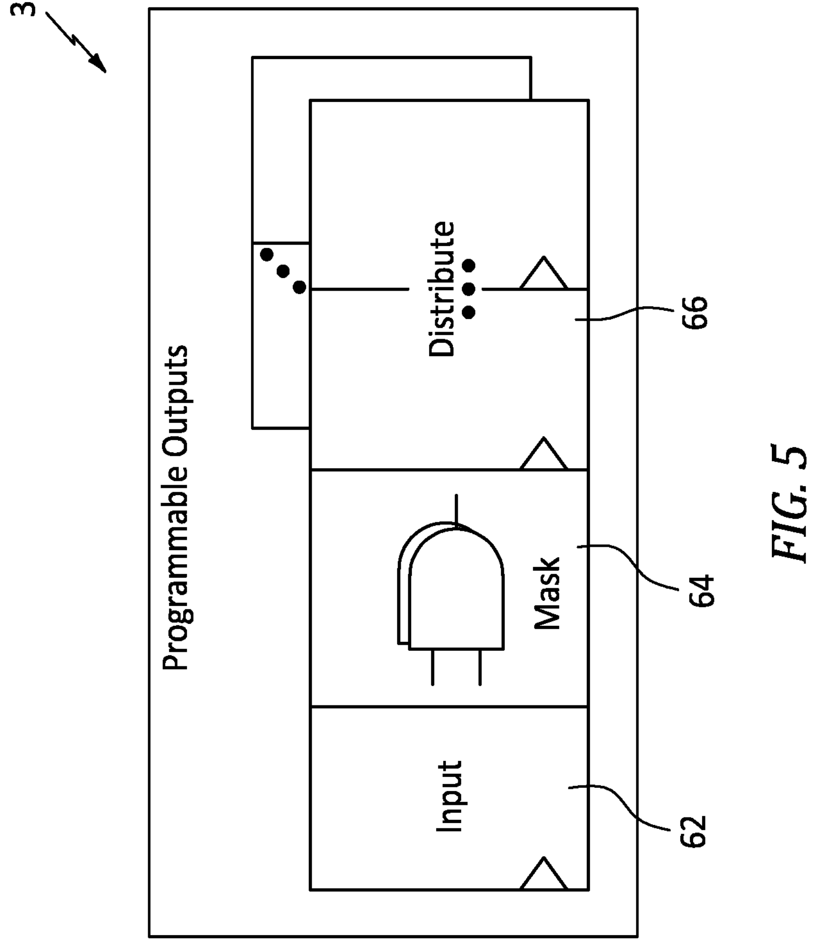
FIG. 5 is a diagrammatic illustration of a programmable output module for the event detection system response controller, in accordance with one or more embodiments of the present disclosure.

Referring to FIG. 5, the programmable output modules 30 facilitate configuration of output behavior of the event detection system response controller 20 as well as routing and timing closure within the event detector controller 20. For example, the programmable output modules 30 are configured to facilitate configuration options for an input mode at an input stage 62 of the programmable output modules 30. The input stage 62 may include configurations options such as, but not limited to, bypass, register, one-shot pulse, and/or latch. The programmable output modules 30 may also provide each output with a mask 64, which mask 64 may be controlled externally to disable a response output given an asserted input. A single input may be fanned out to a user-defined vector width using distribute logic 66 for the output of one of the programmable output modules 30. Each output signal-level may also be configured for active-level. A user configurable pipeline depth may also be provided by the distribute logic 66 to aid in distribution of the outputs across the event detection system response controller 20 and to aid in timing closure. The outputs may be disabled globally by asserting the clear input and individually by asserting the individual mask inputs associated with a particular output. The programmable output modules 30 of FIG. 2 include one or more event detector (ED) system control programmable output modules 56, an event detector (ED) BIT programmable output module 58, and an event detector reset programmable output module 60. The present disclosure, however, is not limited to the foregoing exemplary programmable output modules 30.

The ED system control programmable output modules 56 are connected in signal communication with the event detectors 1002, the subsystems 1004, and/or the processor 1006. The ED system control programmable output modules 56 are configured as an array to auto-scale to produce any number of output vectors to the event detectors 1002, the subsystems 1004 and/or the processor 1006 with the output vectors containing any common number of output bits within each vector. For example, each of the ED system control programmable output modules 56 of the array may be individually configured as discussed above for the programmable output modules 30, thereby allowing the event detection system response controller 20 to adapt to scale and adapt to unique system requirements. Power enables, Interrupts, Safety Interlocks, Subsystem Resets, and Flag notifications can be produced with individual programmable output timing controls of the ED system control programmable output modules 56.

The ED BIT programmable output module 58 is connected in signal communication with and between the ED BIT controller digital filter submodule 42 and the event detectors 1002. The ED BIT programmable output module 58 is individually configurable for input mode, output vector width, output active-level, output mask, and output distribution pipeline depth to generate a BIT output signal for the event detectors 1002.

The ED reset programmable output module 60 is connected in signal communication with and between the ED reset controller digital filter submodule 44 and the event detectors 1002. The ED reset programmable output module 60 is individually configurable for input mode, output vector width, output active-level, output mask, and output distribution pipeline depth to generate a reset output signal for the event detectors 1002.

The timer module 32 counts down the time remaining following a valid event detection before initiating subsystem 1004 recovery. The timer module 32 may, for example, control the timing by feeding back the timer done output or by external logic processing the count. In some embodiments of the ED system response module 24, the timer module 32 may not be necessary for timing control if the pulse shaper 54 for the system validation digital filter submodule 38 (see FIG. 4) is set to the duration required for system intervention. However, the timer module 32 may still be used to provide additional external status or as a diagnostic aid.

The present disclosure event detection system response controller 20 provides a scalable, adaptable, and configurable architecture for processing event detections within electrical systems to minimize false event detections while providing system notification, intervention, control, and managed recovery. The event detection system response controller 20 architecture provides particular utility for electrical systems exposed to harsh environmental conditions, such as nuclear radiation, which may significantly increase the likelihood of false detections and/or SEUs. The event detection system response controller 20 facilitates generation of status and interrupt signals upon detection of filter and/or validation faults signifying that an electrical transient was detected or that an error has occurred in one of the event detectors 1002 or the interface between the event detectors 1002 and the event detection system response controller 20. Individual lockouts facilitate additional control during normal operation of the electrical system 1000 to disable detection at the interface or system levels. These lockouts combined with transient detection provide a means for the processor 1006 (e.g., the host system) to analyze input signals and disable faulty detection devices, thereby allowing the electrical system 1000 to perform without upset or interruption when exposed to harsh environments (e.g., high-level nuclear radiation environment). This visibility may also, in some cases, allow the processor 1006 to disable system interruption during electronic warfare attacks provided that the processor 1006 can process and discern the transient fault conditions and correlate them with attack signatures. Electronic attack detection, suppression, and processing are heavily dependent on filter configuration and host capability. The status and fault detection functions of the event detection system response controller 20 are invaluable for determining system integrity during operation of the electrical system 1000.

While the principles of the disclosure have been described above in connection with specific apparatuses and methods, it is to be clearly understood that this description is made only by way of example and not as limitation on the scope of the disclosure. Specific details are given in the above description to provide a thorough understanding of the embodiments. However, it is understood that the embodiments may be practiced without these specific details.

It is noted that the embodiments may be described as a process which is depicted as a flowchart, a flow diagram, a block diagram, etc. Although any one of these structures may describe the operations as a sequential process, many of the operations can be performed in parallel or concurrently. In addition, the order of the operations may be rearranged. A process may correspond to a method, a function, a procedure, a subroutine, a subprogram, etc.

The singular forms "a," "an," and "the" refer to one or more than one, unless the context clearly dictates otherwise. For example, the term "comprising a specimen" includes single or plural specimens and is considered equivalent to the phrase "comprising at least one specimen." The term "or" refers to a single element of stated alternative elements or a combination of two or more elements unless the context clearly indicates otherwise. As used herein, "comprises" means "includes." Thus, "comprising A or B," means "including A or B, or A and B," without excluding additional elements.

It is noted that various connections are set forth between elements in the present description and drawings (the contents of which are included in this disclosure by way of reference). It is noted that these connections are general and, unless specified otherwise, may be direct or indirect and that this specification is not intended to be limiting in this respect. Any reference to attached, fixed, connected or the like may include permanent, removable, temporary, partial, full and/or any other possible attachment option.

No element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprise", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

While various inventive aspects, concepts and features of the disclosures may be described and illustrated herein as embodied in combination in the exemplary embodiments, these various aspects, concepts, and features may be used in many alternative embodiments, either individually or in various combinations and sub-combinations thereof. Unless expressly excluded herein all such combinations and sub-combinations are intended to be within the scope of the present application. Still further, while various alternative embodiments as to the various aspects, concepts, and features of the disclosures—such as alternative materials, structures, configurations, methods, devices, and components, and so on—may be described herein, such descriptions are not intended to be a complete or exhaustive list of available alternative embodiments, whether presently known or later developed. Those skilled in the art may readily adopt one or more of the inventive aspects, concepts, or features into additional embodiments and uses within the scope of the present application even if such embodiments are not expressly disclosed herein. For example, in the exemplary embodiments described above within the Detailed Description portion of the present specification, elements may be described as individual units and shown as independent of one another to facilitate the description. In alternative embodiments, such elements may be configured as combined elements.

The invention claimed is:

1. An event detection system response controller for an electrical system including one or more event detectors, the event detection system response controller comprising:

at least one event detector (ED) digital filter submodule having a signal input and a signal output, the at least one ED digital filter submodule is configured to receive at least one event signal output from the one or more event detectors at the signal input, and each of the at least one ED digital filter submodule includes a signal synchronizer, a signal filter, an interface validator, an interface validation filter, and a pulse shaper sequentially arranged from the signal input to the signal output, the signal synchronizer synchronizes the at least one event signal output to a digital clock domain of the event detection system response controller to generate an array of synchronized signal outputs, the signal filter applies a first filtering criteria to the array of synchronized signal outputs to generate an array of filtered signal outputs, the interface validator validates the array of filtered signal outputs using a correlated relationship of the array of filtered signal outputs, and the interface validator generates a valid single-bit event output in response to validation of the array of filtered signal outputs, the interface validator filter applies a second filtering criteria to the valid single-bit event output to generate a single-bit filtered event output, and the pulse shaper shapes a pulse duration of the single-bit filtered event output to generate a single-bit ED digital filter output signal at the signal output.

2. The event detection system response controller of claim 1, wherein the first filtering criteria includes a minimum pulse-width criterion.

3. The event detection system response controller of claim 1, wherein the signal filter generates the filtered signal output, a transient detection interrupt signal, and transient state information for the synchronized signal output.

4. The event detection system response controller of claim 1, wherein the second filtering criteria includes a minimum count criterion.

5. The event detection system response controller of claim 1, wherein the at least one ED digital filter submodule includes one or more ED validation digital filter submodules, each of the one or more ED validation digital filter submodule is configured to be connected in signal communication with a respective one of the one or more event detectors to receive an event detect signal at the signal input.

6. The event detection system response controller of claim 5, further comprising a system validation digital filter submodule having a second signal input and a second signal output, the system validation digital filter submodule is connected in signal communication with each of the one or more ED validation digital filter submodules to receive the single-bit ED digital filter output signal at the second signal input from each of the one or more ED validation digital filter submodules, and the system validation digital filter submodule is configured to filter one or more signal transients or single-event upset (SEU) signals of the single-bit ED digital filter output signal.

7. The event detection system response controller of claim 6, wherein the system validation digital filter submodule includes a second interface validator, a second interface validation filter, and a second pulse shaper sequentially arranged from the second signal input to the second signal output.

8. The event detection system response controller of claim 1, wherein the at least one ED digital filter submodule includes an ED BIT controller digital filter submodule, and the ED BIT controller digital filter submodule is configured to generate a BIT request for one of the one or more event detectors.

9. The event detection system response controller of claim 1, wherein the at least one ED digital filter submodule includes an ED reset controller digital filter submodule, and the ED reset controller digital filter submodule is configured to generate a reset request for one of the one or more event detectors.

10. The event detection system response controller of claim 1, wherein the array of synchronized signal outputs and the array of filtered signal outputs include a first number of signal outputs equal to a second number of signal outputs of the at least one event signal output.

11. The event detection system response controller of claim 1, further comprising at least one programmable output module connected in signal communication with the signal output of the at least one ED digital filter submodule.

12. An electrical system including:

a host processor;

one or more event detectors, and each of the one or more event detectors is configured to identify an occurrence of an event and generate an event output signal in response to the identification of the occurrence of the event; and an event detection system response controller connected in signal communication with and between the host processor and the one or more event detectors, the event detection system response controller includes at least one event detector (ED) digital filter submodule having a signal input and a signal output, the at least one ED digital filter submodule is configured to receive the event output signal from the one or more event detectors at the signal input, detect a false detection state of the event output signal, suppress the event output signal, and report the false detection state of the event output signal to the host processor, and each of the at least one ED digital filter submodule includes a signal filter, an interface validator, an interface validation filter, and a pulse shaper sequentially arranged from the signal input to the signal output.

13. The electrical system of claim 12, wherein:

the signal filter applies a first filtering criteria to the event output signal to generate a filtered signal output, the interface validator validates the filtered signal output and generates a valid single-bit event output in response to validation of the filtered signal output, the interface validator filter applies a second filtering criteria to the valid single-bit event output to generate a single-bit filtered event output, and the pulse shaper shapes a pulse duration of the single-bit filtered event output to generate a single-bit ED digital filter output signal at the signal output.

14. The electrical system of claim 13, wherein the first filtering criteria includes a minimum pulse-width criterion.

15. The electrical system of claim 13, wherein the second filtering criteria includes a minimum count criterion.

16. The electrical system of claim 13, wherein the at least one ED digital filter submodule includes one or more ED validation digital filter submodules, each of the one or more ED validation digital filter submodule is configured to be connected in signal communication with a respective one of the one or more event detectors to receive an event detect signal at the signal input.

17. The electrical system of claim 16, wherein the event detection system response controller further includes a system validation digital filter submodule having a second signal input and a second signal output, the system validation digital filter submodule is connected in signal communication with each of the one or more ED validation digital filter submodules to receive the single-bit ED digital filter output signal at the second signal input from each of the one or more ED validation digital filter submodules, and the system validation digital filter submodule is configured to filter a single-event upset (SEU) signal of the single-bit ED digital filter output signal.

18. The electrical system of claim 17, wherein the system validation digital filter submodule includes a second interface validator, a second interface validation filter, and a second pulse shaper sequentially arranged from the second signal input to the second signal output.

19. The electrical system of claim 12, wherein the at least one ED digital filter submodule includes an ED BIT controller digital filter submodule, and the ED BIT controller digital filter submodule is configured to generate a BIT request for one of the one or more event detectors.

20. The electrical system of claim 12, wherein the at least one ED digital filter submodule includes an ED reset controller digital filter submodule, and the ED reset controller digital filter submodule is configured to generate a reset request for one of the one or more event detectors.

* * * * *